US011421815B2

(12) United States Patent
Yamada

(10) Patent No.: US 11,421,815 B2
(45) Date of Patent: Aug. 23, 2022

(54) STAND, STAND SYSTEM, AND ROTATING UNIT FOR DISPLAY DEVICE

(71) Applicant: Ricoh Company, Ltd., Tokyo (JP)

(72) Inventor: Masamichi Yamada, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 17/167,441

(22) Filed: Feb. 4, 2021

(65) Prior Publication Data
US 2021/0247018 A1 Aug. 12, 2021

(30) Foreign Application Priority Data

Feb. 7, 2020 (JP) .............................. JP2020-020094
Dec. 8, 2020 (JP) .............................. JP2020-203381

(51) Int. Cl.
*F16M 11/10* (2006.01)
*H05K 5/02* (2006.01)
*H05K 5/00* (2006.01)
*F16M 11/42* (2006.01)

(52) U.S. Cl.
CPC ......... *F16M 11/105* (2013.01); *H05K 5/0017* (2013.01); *H05K 5/0204* (2013.01); *F16M 11/42* (2013.01); *F16M 2200/024* (2013.01); *H05K 5/023* (2013.01); *H05K 5/0221* (2013.01)

(58) Field of Classification Search
None
See application file for complete search history.

(56) References Cited

U.S. PATENT DOCUMENTS

| 6,443,408 | B1 * | 9/2002 | Hung | F16M 11/2021 |
| | | | | 248/176.1 |
| 8,162,268 | B1 * | 4/2012 | Huang | F16M 11/2085 |
| | | | | 248/920 |
| 8,611,074 | B2 * | 12/2013 | Hari | H05K 5/0017 |
| | | | | 340/854.3 |
| 9,607,532 | B2 * | 3/2017 | Gibson | G09F 7/22 |
| 9,933,106 | B2 * | 4/2018 | Stark | B62B 3/10 |
| 10,638,620 | B2 * | 4/2020 | Huang | F16M 11/10 |
| 10,890,288 | B2 * | 1/2021 | Gurr | F16F 15/10 |
| 2003/0001057 | A1 * | 1/2003 | Sweere | F16M 11/24 |
| | | | | 248/276.1 |

(Continued)

FOREIGN PATENT DOCUMENTS

JP 6539952 7/2019

*Primary Examiner* — Xanthia C Cunningham
(74) *Attorney, Agent, or Firm* — Xsensus LLP

(57) ABSTRACT

A stand for suspending a display device includes a stand mechanism including supporting posts and a mounting plate connecting between the supporting posts; and a rotating unit configured to change orientation of the display device between a landscape orientation and a portrait orientation without detaching the display device, wherein the rotating unit includes a rotating unit fixed part fixed to the stand mechanism, and a rotating unit moving part fixed to a rear surface of the display device and configured to move together with the display device, wherein the rotating unit fixed part includes a fixing plate having two or more holes, a large spacer having two or more holes, and two or more small spacers each having one hole, and wherein the rotating unit moving part includes a sliding planar part having two or more holes.

9 Claims, 14 Drawing Sheets

(56) References Cited

U.S. PATENT DOCUMENTS

| | | | | |
|---|---|---|---|---|
| 2004/0149873 A1* | 8/2004 | Ishizaki | ............ | F16M 11/2064 |
| | | | | 248/274.1 |
| 2008/0055832 A1* | 3/2008 | Ozolins | ............ | F16M 11/2014 |
| | | | | 361/679.04 |
| 2009/0242722 A1* | 10/2009 | Lee | ............ | F16M 11/2021 |
| | | | | 248/371 |
| 2009/0314912 A1* | 12/2009 | Whitley | ............ | F16M 11/16 |
| | | | | 248/299.1 |
| 2010/0252695 A1* | 10/2010 | Liu | ............ | F16M 11/2021 |
| | | | | 248/122.1 |
| 2012/0261362 A1* | 10/2012 | Skull | ............ | F16M 11/22 |
| | | | | 248/225.11 |
| 2013/0279090 A1* | 10/2013 | Brandt | ............ | H05K 7/00 |
| | | | | 361/679.01 |
| 2015/0211675 A1* | 7/2015 | Shyu | ............ | F16M 11/046 |
| | | | | 248/125.7 |
| 2016/0176547 A1* | 6/2016 | Kalman | ............ | F16D 3/10 |
| | | | | 464/157 |
| 2017/0339800 A1* | 11/2017 | Burns | ............ | F16M 11/041 |
| 2020/0409410 A1* | 12/2020 | Kawaguchi | ............ | G06F 1/1605 |

\* cited by examiner

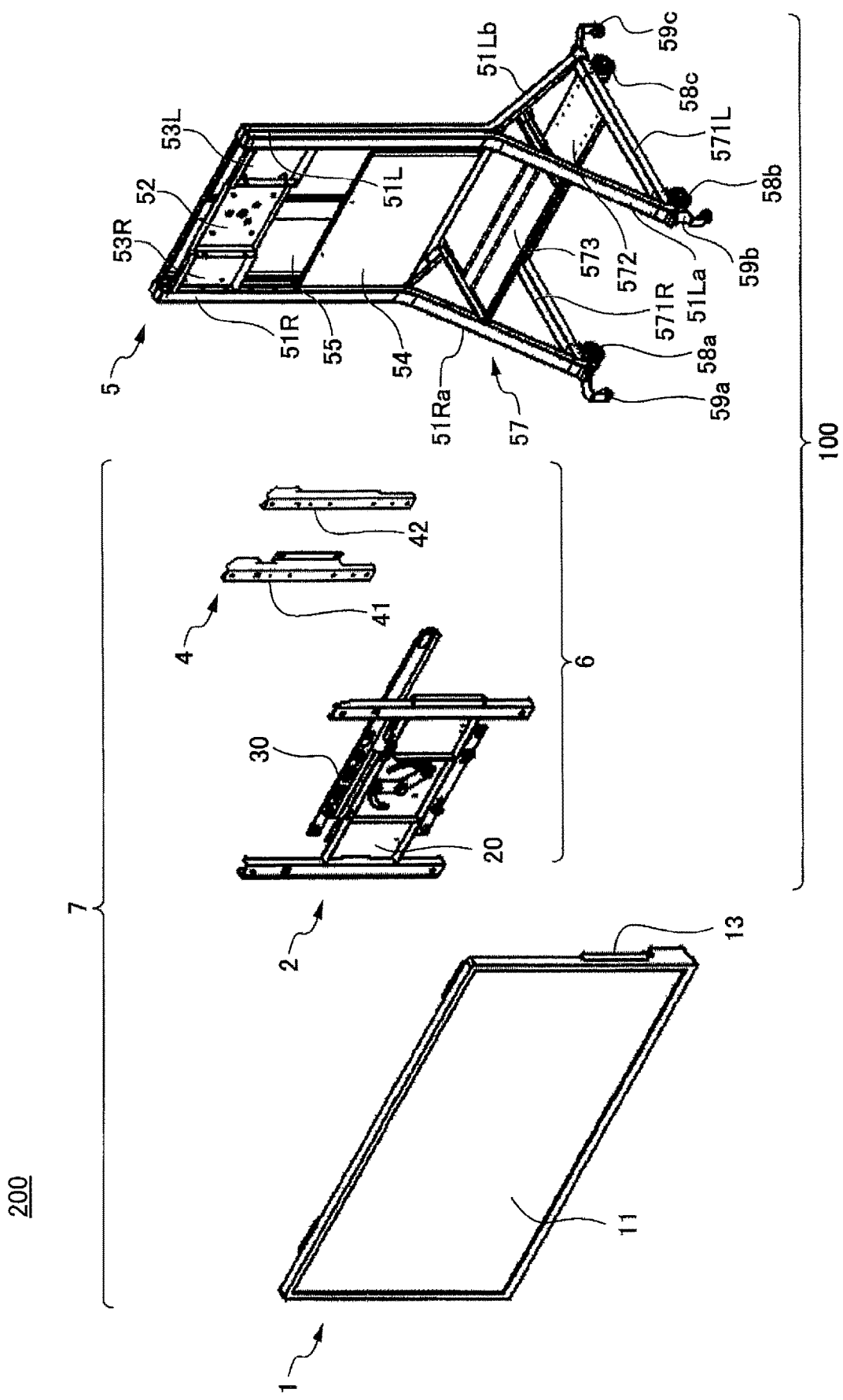

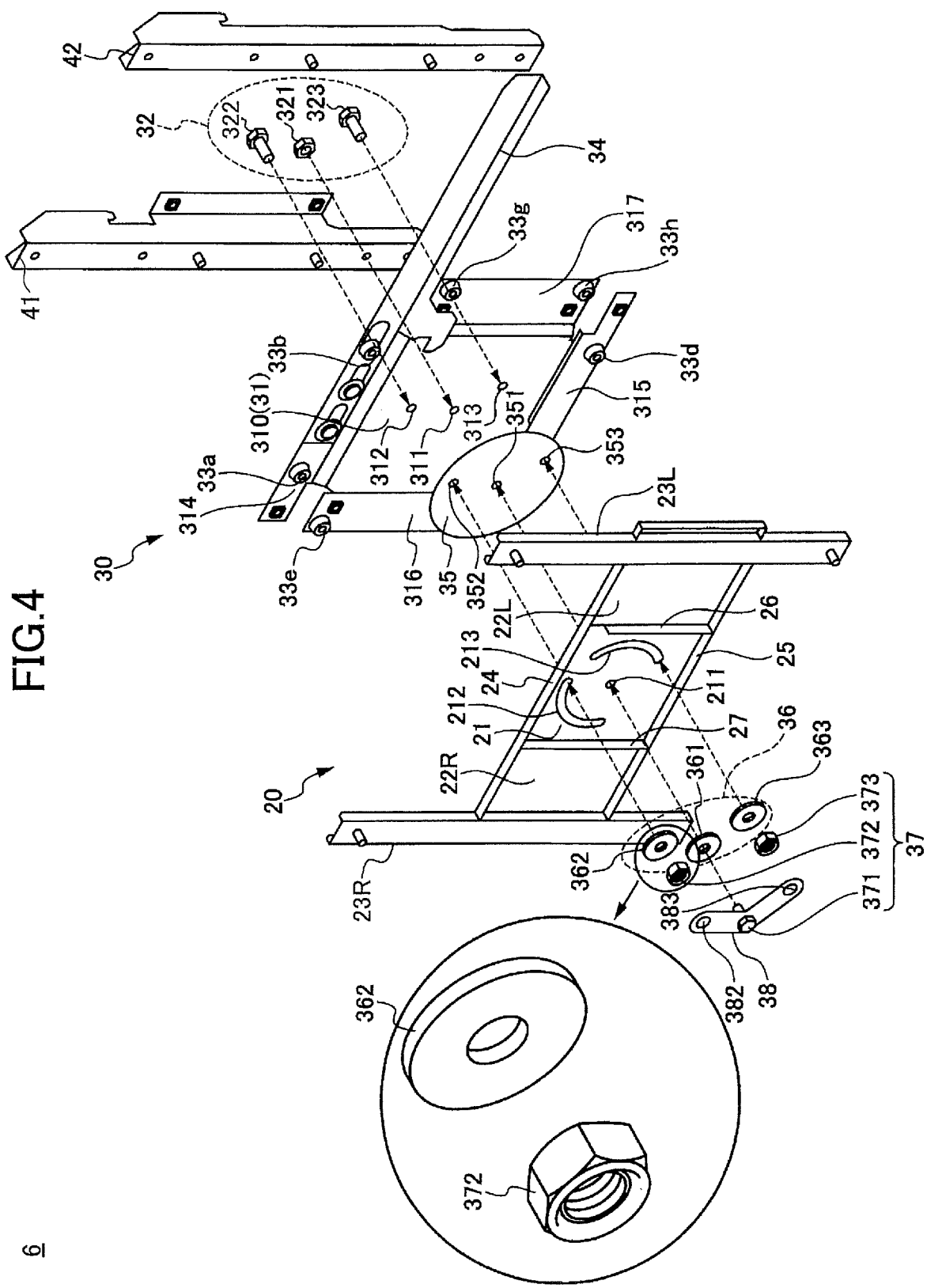

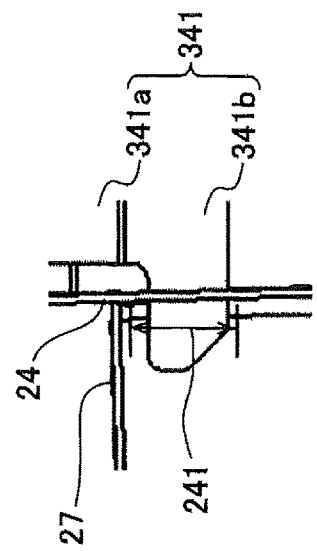
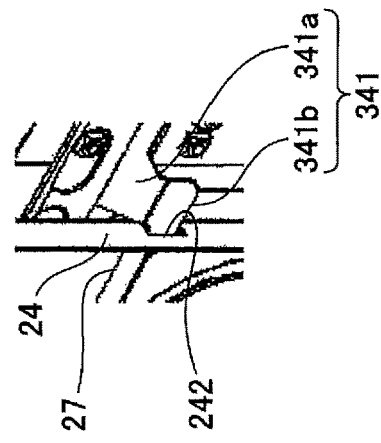
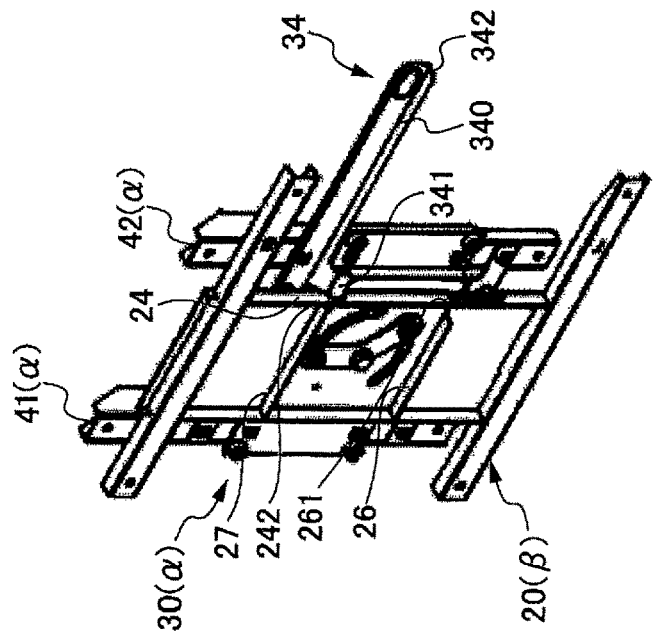

STAND, STAND SYSTEM, AND ROTATING UNIT FOR DISPLAY DEVICE

CROSS-REFERENCE TO RELATED APPLICATION

The present application is based on and claims priority under 35 U.S.C. § 119 to Japanese Patent Application No. 2020-020094, filed on Feb. 7, 2020, and Japanese Patent Application No. 2020-203381, filed on Dec. 8, 2020, the contents of which are incorporated herein by reference in their entirety.

BACKGROUND OF THE INVENTION

1. Field of the Invention

The disclosure discussed herein relates to a stand, a stand system, and a rotating unit for display device. More specifically, the disclosure relates to a stand for supporting a display such as a monitor, an interactive whiteboard, and an electronic blackboard, a stand system having a display and a stand, and a rotating unit for a display.

2. Description of the Related Art

The related art discloses a stand configured to suspend a large display device (30 inch or larger display, an interactive whiteboard, an electronic whiteboard, etc.) in a stand-alone state (e.g., Patent Document 1).

Patent Document 1 discloses a display stand having a weight portion at a lower rearward position such that the center of gravity of the overall display stand is located as close to a lower rearward position as possible, thereby reducing a protruded amount of the stand front legs from a display screen as well as reducing the installation space.

However, the recent use of large display devices has become more diverse, and there is a growing need for a user to manually change orientation of a large display device in a landscape (horizontal) or portrait (vertical) orientation.

Thus, in order to meet such a need, a rotating unit is provided as a separate option for a particular user to allow rotation of the display device. However, while an optional rotating unit has added value in that the optional rotating unit is designed for a user to manually change the display device in the portrait and landscape orientations, the display device with such an optional rotating unit is normally unstable, and rattling may occur when a slight load is applied to the display device. Especially, in the case where a display device is an interactive whiteboard or an electronic blackboard, rattling occurs when a user is writing characters or drawings on the display device.

RELATED-ART DOCUMENT

Patent Document

Patent Document 1: Japanese Patent No. 6539952

SUMMARY OF THE INVENTION

Accordingly, one aspect of the present disclosure provides a stand for suspending a display device. The stand includes a stand mechanism including a plurality of supporting posts and a mounting plate connecting between the plurality of supporting posts; and a rotating unit configured to change orientation of the display device between a landscape orientation and a portrait orientation without detaching the display device, the display device being horizontally supported in the landscape orientation, and the display device being vertically supported in the portrait orientation, wherein the rotating unit includes a rotating unit fixed part fixed to the stand mechanism, and a rotating unit moving part fixed to a rear surface of the display device and configured to move together with the display device, wherein the rotating unit fixed part includes a fixing plate having two or more holes, a large spacer having two or more holes, and two or more small spacers each having one hole, and wherein the rotating unit moving part includes a sliding planar part having two or more holes, wherein in a state where a rear surface of the sliding planar part is in surface contact with a front surface of the large spacer, and peripheries of the two or more holes of a front surface of the sliding planar part are in surface contact with the two or more small spacers, the fixing plate and the sliding planar part are coupled by fastening two or more first fasteners with respective second fasteners, the two or more first fasteners having respective shaft portions and being inserted into the two or more holes of the fixing plate, the two or more holes of the large spacer, the two or more holes of the sliding planar part, and the two or more holes of the small spacers so as to be fastened with the second fasteners having respective hole portions, and wherein the front surface of the large spacer continues to be in contact with peripheries of the two or more holes of the rear surface of the sliding planar part while positions of the two or more holes of the sliding planar part move together with rotation of the display device.

BRIEF DESCRIPTION OF THE DRAWINGS

FIG. 2 is an exploded perspective view illustrating the display stand system according to the present embodiment;

FIG. 4 is an exploded perspective view illustrating a rotational mounting mechanism according to the present embodiment;

FIGS. 9A to 9E are views illustrating the locking member when the display is in a portrait orientation.

DETAILED DESCRIPTION OF THE PREFERRED EMBODIMENTS

Figure 1A:
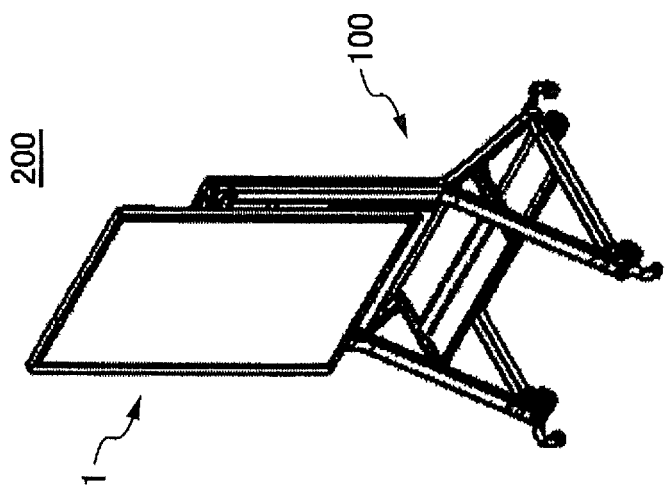
FIGS. 1A and 1B are overall views illustrating a display stand system according to a present embodiment.

In view of the above-described circumstances, an object of the present disclosure is to provide a rotatable stand capable of preventing generation of rattling when a user is writing on a display device.

Hereinafter, an embodiment for carrying out the present invention will be described with reference to the accompanying drawings. In the present specification and the drawings, components having substantially the same functional configuration are denoted by the same reference numerals, and the description thereof will not be repeated.

The present disclosure relates to a display stand, and a display stand system having the display stand. As a display to be suspended by the display stand, the following examples may be expected.

Such a display may include, for example, an analog board such as a whiteboard, blackboard, canvas; an active display device that is an electronic panel (digital board) such as an interactive whiteboard, an interactive flat panel display, and a touch panel; or a passive display device such as a monitor, television, or the like. Hereinafter, an embodiment for carrying out the present invention will be described with reference to the accompanying drawings.

<Overall View>

Figure 1B:
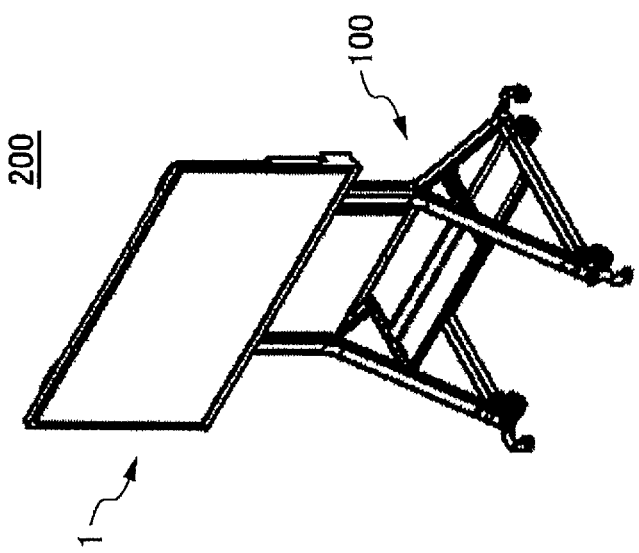

FIGS. 1A and 1B are overall views illustrating a display stand system according to the present embodiment. Specifically, FIG. 1A is a front perspective view illustrating a display stand system 200 according to the present embodiment in which a display 1 is in a landscape orientation, and FIG. 1B is a front perspective view illustrating the display stand system 200 in which the display 1 is in a portrait orientation.

The display 1, acting as a display device, is attached to a display stand (also referred to as a stand for display or a stand) 100, which thus becomes a display stand system (also referred to as a stand system) 200.

Normally, a display device such as a monitor, a display or an input screen used in a so-called electronic blackboard device (an interactive whiteboard used in conferences, classes, meetings, etc.,) is suspended and held by a dedicated stand.

The display stand 100 is required to hold the display 1 rotatably so that the state can be changed depending on which orientation the display 1 is desired to be used in, the orientation being a portrait (vertical) state or a landscape (horizontal) state.

By disposing the display 1 in the landscape orientation as in FIG. 1A, a user can write on the display 1 in the same manner as a user writes on a typical analog whiteboard or blackboard.

It is convenient to dispose the display 1 in the portrait orientation as illustrated in FIG. 1B in order to display vertically long materials. Further, as illustrated in FIG. 1B, by disposing the display 1 in the portrait orientation, the width of the display 1 can be approximately the same as the distance between supporting posts 51R and 51L configured to support the display 1. Thus, multiple identical types of the display stand systems 200 can be loaded for exhibitions and the like, without taking up much space in the width of the cargo.

Figure 3A:
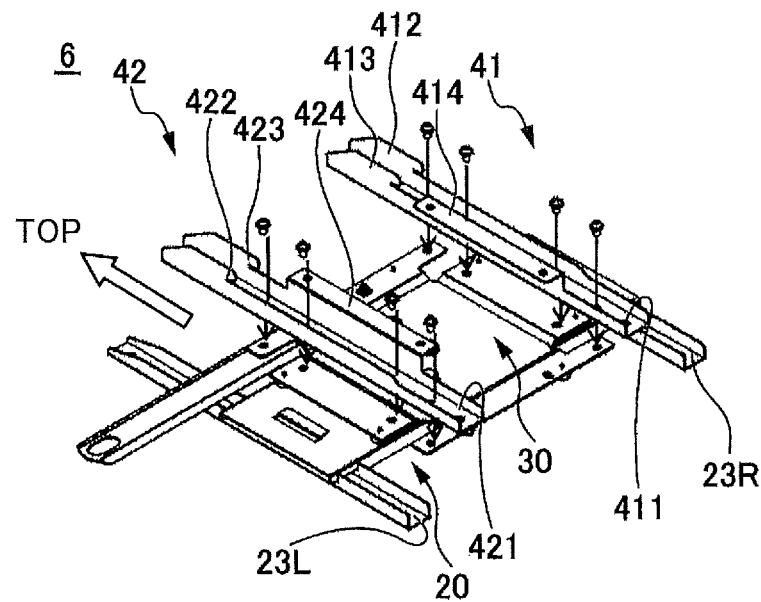
FIGS. 3A to 3C are views illustrating assembly of the display stand system according to the present embodiment.
Figure 3B:
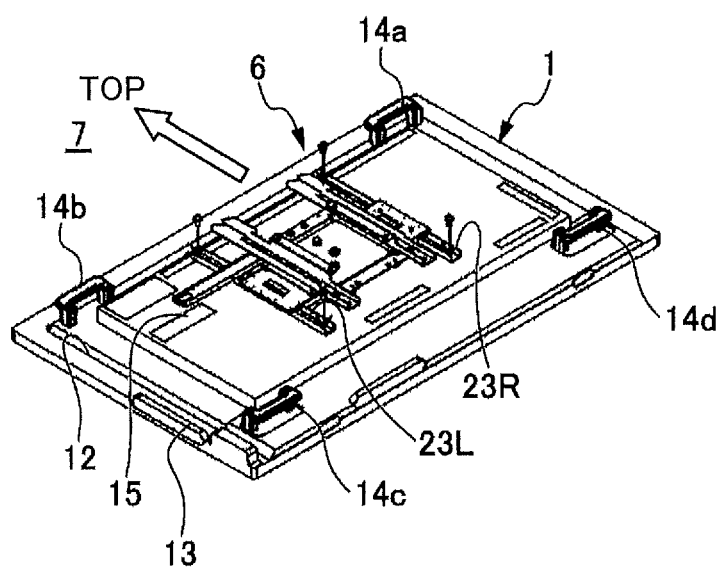
Figure 3C:
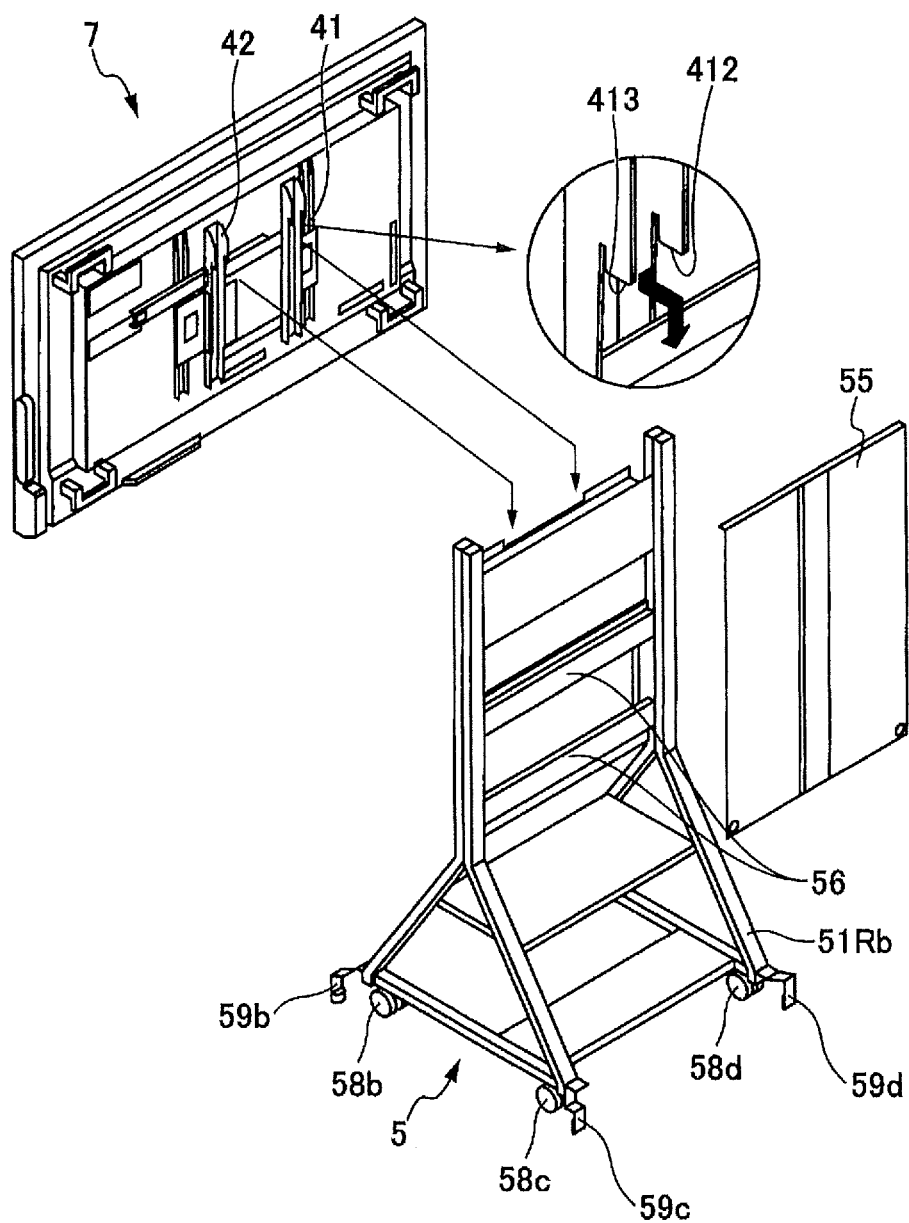

FIG. 2 is an exploded perspective view illustrating the display stand system 200 according to the present embodiment. FIGS. 3A to 3C are views illustrating assembly of the display stand system 200 according to the present embodiment.

The components of the display stand system 200 will now be described with reference to FIG. 2 and FIGS. 3A to 3C.

Referring to FIG. 2, the display stand system 200 according to the present embodiment includes a display 1, a rotating unit 2, a bracket member 4, and a stand mechanism 5. In the display stand system 200, components excluding the display 1 correspond to a display stand 100.

The display 1 has a display surface 11 and a rear surface 12, and an operating portion 13 is disposed on a side of the display 1. Referring to FIG. 3B, four corners of the rear surface 12 are provided with handles 14a, 14b, 14c, and 14d. A locking operation groove 15 is formed on the rear surface 12.

The rotating unit 2 includes a rotating unit moving part 20 and a rotating unit fixed part 30. The configuration of the rotating unit 2 is described in detail with reference to FIG. 4.

The bracket member 4 is composed of left and right brackets 41 and 42. More specifically, referring to FIG. 3A, the bracket 41 (42) is composed of a device-side mounting post 411 (421), fitting hooks 412 and 413 (422 and 423), and a stand-side mounting plate 414 (424).

The stand mechanism 5 includes supporting posts 51R and 51L, a mounting plate 52, supporting plates 53R and 53L, a front cover 54, a rear cover 55, reinforcement beams 56 (see FIG. 3C), a base part 57, casters 58a to 58d, and caster retainers 59a to 59d.

Lower parts of the supporting posts 51R and 51L are each branched forward and backward to form lower inclined supporting posts (51Ra and 51Rb, and 51La and 51Lb). In addition, lower supporting posts 571R and 571L are disposed to connect lower ends of the supporting posts 51R and 51L. In addition, the stand mechanism 5 has a lower end reinforcement plate 572 between the lower supporting posts 571R and 571L. Still further, the stand mechanism 5 includes a reinforcement rack 573 beneath the supporting posts 51R and 51L.

In general, the display stand 100 tends to be small, light, and easy to move. The size and weight of the base part 57 are major factors contributing to the mobility of the display stand 100.

Further, the display 1, such as an interactive whiteboard or an electronic blackboard, displays images and the like, and also receives a user's writing operation on the display 1. Since a load is applied to the display 1 by the user's writing behaviors, stability is required so that the display 1 does not move against a given load relative to the display stand 100 that suspends the display 1.

Thus, the size and weight of the base part 57 are designed such that the display stand 100 can withstand not only the load from the front of the display 1 but also the load from the lateral and the rear of the display 1.

In the following, R and L are affixed at the end of reference numerals for members that are paired on the left and right, such as the posts 51R and 51L, and whose configuration and function are substantially the same. Since the display stand system 200 according to the present embodiment is assembled in viewing from the rear side as illustrated in FIGS. 3A to 3C, R is provided for the member on the right side viewing from the rear side and on the left side viewing from the front side, and L is provided for the member on the left side viewing from the rear side and on the right side viewing from the front side. The same applies to other members.

Referring to FIG. 2 and FIGS. 3A to 3C, the assembly of the display stand system 200 according to the present embodiment will now be described.

First, referring to FIGS. 2 and 3A, the attachment posts 411 and 421 of right and left brackets 41 and 42 are threadably engaged with the rear side of the rotating unit fixed part 30 of the rotating unit 2, so that the right and left brackets 41 and 42 are integrated with the rotating unit 2 to form the rotational mounting mechanism 6.

Then, referring to FIGS. 2 and 3B, moving-side supporting posts 23R and 23L of the rotating unit moving part 20 of the rotational mounting mechanism 6 are threadably engaged with the rear surface 12 of the display 1, and the rotational mounting mechanism 6 is integrated with the display 1 to form a mounting mechanism-attached display 7.

Referring to FIGS. 2 and 3C, fitting hooks 412 and 413 (422 and 423) of the brackets 41 and 42 of the mounting mechanism-attached display 7 are positioned by hooking the fitting hooks 412 and 413 on an upper end of a mounting plate 52 of the stand mechanism 5. Then, a rear cover 55 of the stand mechanism 5 is removed, and the brackets 41 and 42 are attached to the mounting plate 52 of the stand mechanism 5.

Then, the rear cover 55, which has been removed once, is mounted onto the support posts 51R and 51L and the supporting plates 53R and 53L of the stand mechanism 5.

FIGS. 3A to 3C illustrate an attachment procedure when the rotating unit 2 is attached to a rear surface 12 of the display 1. However, when the rotating unit 2 is not required, the brackets 41 and 42 may be attached to the rear surface 12 of the display 1, and the bracket-attached display may be attached to the stand. That is, the rotating unit 2 can be an optional member that is attached to the display 1, and can be used only when necessary.

As illustrated in FIGS. 3A to 3C, the rotating unit 2 is mounted as an initial setting when the display stand 100 suspends the display device 1 to be used for the first time.

Once the display 1 is assembled, the display 1 can be rotated relative to the display stand 100, so that it is not necessary to detach the display 1 when changing orientation of the display 1 (landscape/portrait installation orientation) relative to the stand mechanism 5.

Additionally, the stand mechanism 5 includes casters 58a to 58d beneath the base part 57 configured to support the posts 51R and 51L so as to move (transport) the display stand system 200 in an assembled state. When it is desired to adjust the angle of the display 1 in left and right directions (horizontal direction), the direction of the entire display stand system 200 is adjusted by the casters 58a to 58d.

This arrangement allows for manual movement of the display stand system 200 and manual rotation of the display 1 after initial assembly without disassembling of the components.

In the following examples, a configuration in which the rotating unit moving part can be manually rotated with respect to a fixed part will be described. However, rotation of the rotating unit moving part may be performed automatically by obtaining power from a power source.

Note that for purposes of illustrating operation and fitting, the disassembled components of the display stand system 200 and an interior of each component may be illustrated below.

<Rotational Mounting Mechanism>

Figure 5:
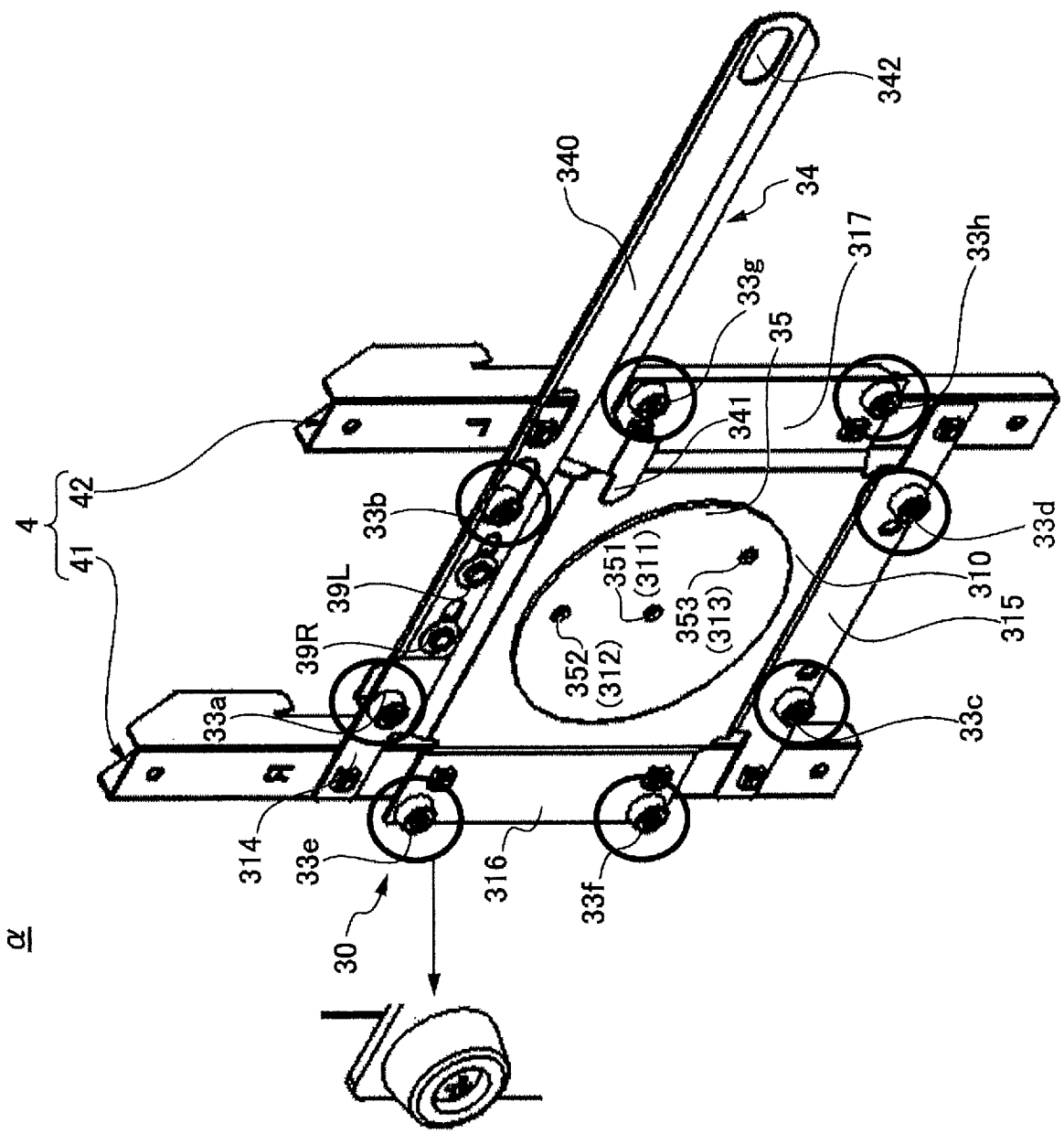
FIG. 5 is a perspective view illustrating a rotating unit fixed part and brackets of a rotational mounting mechanism according to the present embodiment.

Next, the rotational mounting mechanism 6 according to the present embodiment will be described in detail with reference to FIGS. 4 and 5. FIG. 4 is an exploded perspective view illustrating the rotational mounting mechanism 6 according to the present embodiment. FIG. 5 is a perspective view illustrating a rotating unit fixed part 30 and brackets 41 and 42 of the rotational mounting mechanism 6.

The rotating unit 2 includes the rotating unit fixed part 30 fixed to the stand mechanism 5 side, and a rotating unit moving part 20 fastened to the display 1 side so as to be rotated together with the display 1.

The two brackets, that is, the left and right brackets 41 and 42 are mounted on the rotating unit fixed part 30.

Referring to FIG. 4, the rotating unit moving part 20 includes a sliding plate 21, supporting plates 22R and 22L, moving-side supporting posts 23R and 23L, upper and lower supporting frames 24 and 25 (examples of first and second supporting frames), and partition frames 26 and 27 (examples of first and second partition frames).

Specifically, on the rotating unit moving part 20, one face of the sliding plate 21 is a plate-like flat area (flat plate metal part) in contact with the rotating unit fixed part 30, and acts as a sliding surface that slides relative to the rotating unit fixed part 30 during rotation. Three through holes 211, 212 and 213 are formed on the sliding plate 21. The sliding plate 21 is an example of a sliding planar part. The hole 211 is a central hole formed approximately at a center of the sliding plate 21, and the holes 212 and 213 are arc-shaped slots (sliding holes) each formed at the same distance from the central hole 211. Note that the center of the sliding plate 21 is the center between top and bottom of the sliding plate 21, and between the left and right of the sliding plate 21.

The supporting plates 22R and 22L are plate-like members that sandwich support the sliding plate 21 in a horizontal direction. The partition frames 26 and 27 (first and second partition frames) are disposed at left and right boundaries between the sliding plate 21 and the supporting plate 22R and 22L. In addition, upper and lower supporting frames 24 and (first and second supporting frames) are disposed to sandwich the entire area of the sliding plate 21 and the supporting plates 22R and 22L.

Moving-side supporting posts 23R and 23L are rod-like members extending vertically. The moving-side supporting posts 23R and 23L are connected to the supporting plates 22R and 22L, respectively. To mount the rotational mounting mechanism 6 on the display 1, surfaces of the moving-side supporting posts 23R and 23L are brought into contact with a rear surface 12 of the display 1 and are engaged via screws, as illustrated in FIG. 3A.

Meanwhile, the rotating unit fixed part 30 includes a fixing plate 31, a rear-side locking part 32, bushing members 33a to 33h, a locking member 34, a large spacer 35, a small spacer group 36, a front-side locking part 37, and a nut locking part 38.

The fixing plate 31 is a plate-like member that includes a substantially square-shaped central fixing plate 310 having holes 311, 312 and 313, and overhang parts 314, 315, 316 and 317 extending from four sides of the central fixing plate 310.

The rear-side locking part 32 includes a nut 321 and two bolts 322 and 323.

The bushing members 33a to 33h are elastomeric members, such as rubber. In this example, a total of eight bushing members are provided, two each on the upper, lower, left, and right sides. As illustrated in FIG. 5, the bushing members 33a and 33b are horizontally aligned on an upper overhang part 314, and the bushing members 33c and 33d are horizontally aligned on a lower overhang part 315. The bushing members 33e and 33f are vertically aligned on a left overhang part 316, and the bushing members 33g and 33h are vertically aligned on a right overhang part 317.

The locking member 34 is a horizontally extending plate-like member attached to the upper overhang part 314 of the fixing plate 31 by fasteners 39R and 39L. The locking member 34 is a member that is horizontally movable with respect to the fixing plate 31. Details of the locking member 34 will be described later with reference to FIGS. 8A to 8F.

Of the rotating unit fixed part 30, the large spacer 35 acts as a rear-side spacer. The large spacer 35 has a face having a flat area that comes in contact with the rotating unit moving part 20 from the rear side of the rotating unit moving part 20. Of the rotating unit fixed part 30, this flat area of the large spacer 35 is in contact with the sliding plate 21 of the rotating unit moving part 20 while the large spacer 35 slides on the sliding plate 21 during rotation. Accordingly, the large spacer 35 is made of a material that provides smooth and stable coefficients of friction on the front and rear surfaces. The large spacer 35 may be, for example, made of a resin such as POM (polyacetal) or a metal such as phosphor bronze. In addition, three holes 351, 352 and 353 are formed on the large spacer 35. The three holes 351, 352 and 353 are approximately the same sizes as the three holes 311, 312 and 313 formed on the fixing plate 31. The hole 351 (a central hole) on the large spacer 35 is approximately the same size as the central hole 211 on the sliding plate 21.

Returning to FIG. 4, a front-side small spacer group includes three small spacers 361, 362 and 363 each having one hole. Of the rotating unit fixed part 30, the small spacers 361, 362 and 363 are members that come into contact with the rotating unit moving part 20 from the front side of the rotating unit moving part 20, and slide when the sliding plate 21 comes into contact with the small spacers 361, 362 and 363 during rotation.

Thus, the small spacers 361, 362 and 363 each have a surface made of a material capable of obtaining a smooth and stable frictional coefficient. Examples of such a material include a resin such as POM, or a metal such as phosphor bronze, and all the three small spacers 361, 362 and 363 are made of the same material.

A front-side locking part 37 has one bolt 371 and two nuts 372 and 372. A threaded portion of the bolt 371 passes through the hole of the small spacer 361, the central hole 211 of the sliding plate 21, the hole 351 of the large spacer 35, and the hole 311 of the fixing plate 31 so as to engage the nut 321 of the rear-side locking part 32.

The nut 372 is engaged with a threaded portion of the bolt 322 of the rear-side locking part 32. The threaded portion of the bolt 322 has passed through the hole 312 of the fixing plate 31, the hole 352 of the large spacer 35, the slot 212 of the sliding plate 21, and the hole of the small spacer 362. The nut 373 is engaged with a threaded portion of the bolt 323 of the rear-side locking part 32. The threaded portion of the bolt 323 has passed through the hole 313 of the fixing plate 31, the hole 353 of the large spacer 35, the slot 213 of the sliding plate 21, and the hole of the small spacer 363.

The nut locking part 38 is an anti-rotation member having three holes 381, 382 and 383. A threaded portion of the bolt 371 is inserted through the hole 381. The holes 382 and 383 are fitted with outlines of the nuts 372 and 373, respectively. The nut locking part 38 restricts rotation of the nuts 372 and 373 of the front-side locking part 37 relative to the bolts 322 and 323 of the rear-side locking part 32.

When assembling the rotating unit 2, the sliding plate 21 is interposed between the large spacer 35 and the small spacer group 36, and the rear-side locking part 32 and the front-side locking part 37 are engaged with each other to couple the rotating unit moving part 20 and the rotating unit fixed part 30.

Thus, the threaded portions of the bolts 322 and 323 of the rear-side locking part 32, and the threaded portion of the bolt 371 of the front-side locking part 37 penetrate in frontward and rearward directions so as to act as coupling shafts between the rotating unit moving part 20 and the rotating unit fixed part 30.

The bolts 371, 322 and 323 acting as the coupling shafts are defined as first fasteners having shaft portions, and the nuts 321, 372 and 373 are defined as second fasteners having hole portions.

(Fastening Position with Spacer)

Figure 6C:
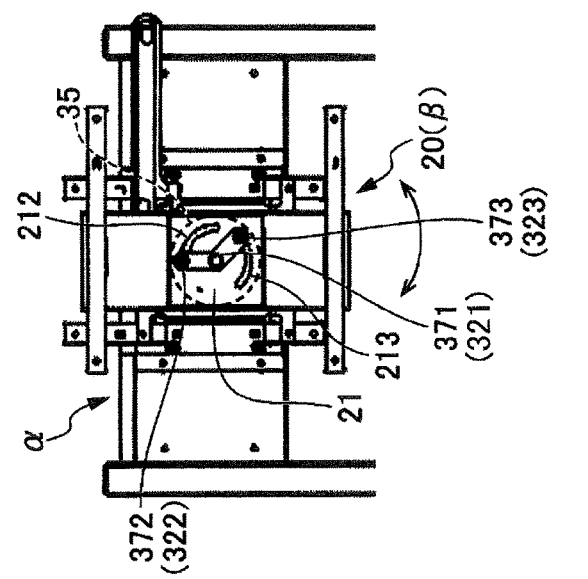
FIGS. 6A to 6C are views illustrating rotation of a rotating unit moving part with respect to a fixed part according to the present embodiment.
Figure 6B:
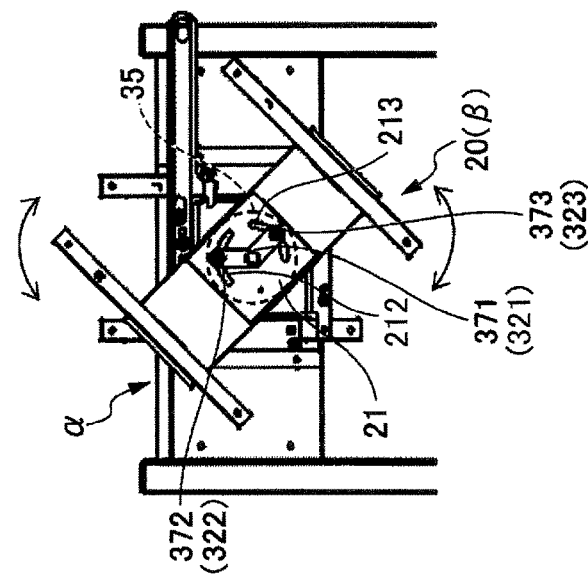
Figure 6A:
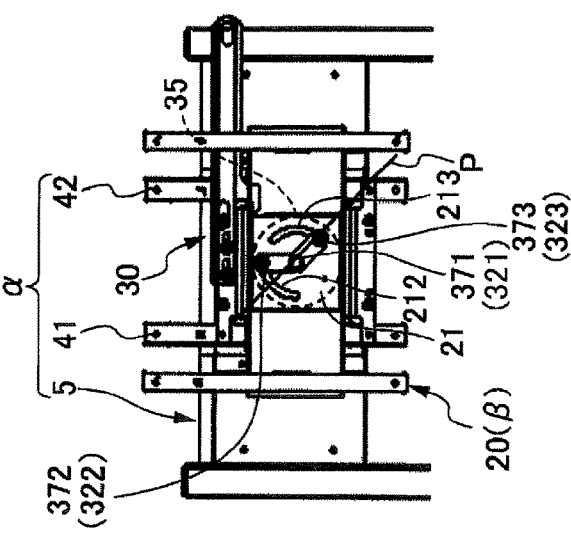

FIGS. 6A to 6C illustrate the rotation of the rotating unit moving part 20 with respect to a fixed part α. In the assembled display stand system 200, the display 1 and the rotating unit moving part 20 correspond to a rotating part β, and the stand mechanism 5, the left and right brackets 41 and 42, and the rotating unit fixed part 30 correspond to the fixed part α.

When rotating the display 1, as illustrated in FIGS. 6A to 6C, the sliding plate 21 rotates about the central hole 211 through which the coupling shaft 371 is inserted, so that the rotating unit moving part 20 rotates relative to the rotating unit fixed part 30. In this case, positions of the two slots 212 and 213 of the sliding plate 21 change with respect to the two coupling shafts 322 and 323.

As described above, the sliding plate 21 of the rotating unit moving part 20 that is in surface contact with the large spacer 35 of the rotating unit fixed part 30 is coupled to the small spacers 361, 362 and 363 via bolts 371, 322 and 323 acting as the coupling shafts and nuts 321, 372 and 373, so that the sliding plate 21 of the rotating unit moving part 20 and the large spacer 35 of the rotating unit fixed part 30 are fastened with a predetermined torque.

Note that shapes of the slots 212 and 213 provided on the sliding plate 21 determine a moving direction of the rotating unit moving part 20 relative to the fixed part α.

The large spacer 35 has an area that encompasses three small spacers 361, 362 and 363 and a front-side locking part 37 (371, 372 and 373) acting as a bolt-nut fastener. That is, when the display 1 is rotated to manually switch between the portrait and landscape orientations, the large spacer 35 is present on an entire rear side area of the sliding plate 21 where the small spacers 361, 362 and 363 are in contact with a front surface of the sliding plate 21.

Since at least three small spacers 361, 362 and 363 are in contact with the front surface of the sliding plate 21, and one large planar spacer 35 is three-dimensionally present on the rear surface of the sliding plate 21 to cover contact areas of the small spacers 361, 362 and 363 from the rear surface, there will be no step during a user's writing on the display and rotating of the display 1. This provides an effect of preventing rattling caused by partial absence of the large spacer 35 during a user's writing on the display and rotating of the display 1.

Further, a planar portion of the large spacer 35 has a size and shape such that the surface of the large spacer 35 continues to contact peripheries of all the holes 211, 212 and 213 (the central hole 211, and the slots 212 and 213) of the rear surface of the sliding plate 21 even when the slots 212 and 213 of the sliding plate 21 rotate with the display 1.

According to this arrangement, when the display 1 is manually rotated, the large spacer 35 is always present around the peripheries of the three holes 211, 212 and 213 of the rear surface of the sliding plate 21 while the positions of the slots 212 and 213 are moved with the sliding plate 21. Additionally, the small spacers 361, 362 and 363 surround the coupling shafts 371, 322 and 323, and the slots 212 and 213 move along the fixed coupling shaft 322 and 323 so that the small spacers 361, 362 and 363 are always in contact with the peripheries of the holes 211, 212 and 213 of the front surface of the sliding plate 21, where the coupling shaft 371, 322 and 323 are inserted into the holes 211, 212 and 213.

The size and shape of the planar portion of the large spacer 35 according to the present embodiment will be described below. The planar portion of the large spacer 35 is a circular shape having a size that covers a virtual circle obtained by connecting arc-shaped slots 212 and 213 remotely separated from the hole 211. That is, the large spacer 35 has a circular shape centered substantially on the hole 351, and is housed inside four sides of the central fixing plate 310.

The size and shape are examples, but not limited to these examples.

As a result, in the holes 211, 212 and 213 of the sliding plate 21, respective peripheries of the coupling shaft 371, 322 and 323 are always interposed between the rear-side large spacer 35 and the front-side small spacer 361, 362 and 363. Thus, the thicknesses of coupling areas do not change during rotation, and generation of rattling can be prevented.

Here, a technique that will not generate rattling according to the position of the coupling shaft will be described.

According to the present embodiment, the three bolts 371, 322 and 323 (i.e., the first fasteners having shaft portions) are illustrated as three coupling shafts during rotation; however, at least two coupling shafts are preferable.

First, the central hole 211, through which a central shaft (the coupling shaft 371) acting as the center of rotation is inserted, is provided at a position substantially center of the sliding plate 21.

Normally, a single rotating shaft can provide a rotating function; however, the suspending display 1 is large and heavy. Thus, when the suspending display 1 is supported by only one point, and a force other than rotation, such as a writing force, is applied to a position remote from the rotating shaft at the center of rotation, rattling may occur.

Accordingly, even when a writing force is applied to a position remotely from the rotating shaft at the center of rotation, a central shaft acting as a rotating shaft, and at least one coupling shaft acting as a sliding shaft sliding along a slot are provided so as to reduce the possibility of rattling.

For example, when it is desired to prevent rattling in a horizontal direction, the coupling shaft 323 is disposed at a horizontally different position from the central shaft 371 acting as the rotating shaft. Thus, the central shaft 371 and the coupling shaft 323 are linearly fastened in the horizontal direction, thereby preventing rattling in the horizontal direction.

In contrast, when it is desired to prevent rattling in a vertical direction, the coupling shaft 322 or 323 is disposed at a vertically different position from the central shaft 371. Thus, the central shaft 371 and the coupling shaft 322, or the central shaft 371 and the coupling shaft 323 are linearly fastened in the vertical direction, thereby preventing rattling in the vertical direction.

For example, by providing a central fastener (371, 321) and a lower right fastener (373, 323), an inclined line is formed by connecting the two coupling shafts 371 and 323. As a result, a line P connecting the shafts 371 and 323 becomes a linear area with respect to the horizontal direction and the vertical direction, thereby preventing rattling in the vertical direction and the horizontal direction.

However, when a writing force is applied in a direction perpendicular to the connected line P, for example, when a writing force is applied in a particular diagonal direction (e.g., in the upper right or lower left direction of FIGS. 6A to 6C), the positions of the coupling shafts 371 and 323 with respect to the direction of the applied force overlap. This results in the same function as fastening at a point. Accordingly, when a force is applied in such a particular diagonal direction, rattling may not be prevented by fastening at two points with the two coupling shafts.

Thus, another coupling shaft (upper fastener 372 and 322) is provided to a portion differing from the line P connecting the two shafts, so that the line connecting the three points of the central shaft and the two coupling shafts becomes a planar form.

Thus, the sliding plate 21 and the fixed part α are fastened in a planar form by the three coupling shafts 371, 322 and 323. This will prevent rattling when any force is applied in the diagonal direction in addition to the vertical direction and the horizontal direction.

When the two coupling shafts 322 and 323 for sliding are 180 degrees apart with the central shaft 371 in between, a portion connecting the three shafts 371, 322 and 323 form a straight line. This indicates that the central shaft 371 and the coupling shaft 322 are fastened in a linear form. Hence, it is preferable that the angle of the line connecting the central shaft 371 and the coupling shaft 322, and the angle of the line connecting the central shaft 371 and the coupling shaft 323 be set greater than 90 degrees and less than 180 degrees.

In this configuration, the rotating unit moving part 20 and the rotating unit fixed part 30 are connected in a planar form by two, and more preferably, three coupling shafts instead of one. Thus, it is possible to prevent rattling even when a writing load is applied to the display 1.

Furthermore, since the three coupling shafts 371, 322 and 323 penetrate both the large spacer 35 and the sliding plate 21, the large spacer 35 having holes 351, 352 and 353 with sizes corresponding to the coupling shafts 371, 322 and 323 contacts the sliding plate 21 from the rear surface of the sliding plate 21. This arrangement also prevents generation of rattling during writing on the display because the sliding plate 21 is supported at three points by planar pressure from the rear surface of the sliding plate 21 applied by the large spacer 35.

The three pairs of fasteners (321, 371), (322, 372), and (323, 373) are each composed of a bolt and a nut, but a bolt and a nut may be reversely arranged. In this example, a bolt and a nut are described as examples of a first fastener and a second fastener, where the first fastener has a shaft portion (a coupling shaft) and the second fastener has a hole portion. However, the first fastener may be another fastener having a male threaded structure configured to penetrate large and small spacers and a sliding plate, and the second fastener may be another fastener having a female threaded structure. The second fastener having a hole portion may be a fastener having a hole penetrating therethrough, such as a hex nut or a wing screw, or may be a fastener having a recess not penetrating therethrough, such as a cap nut.

(Positions of Bushing Members)

Figure 7A:
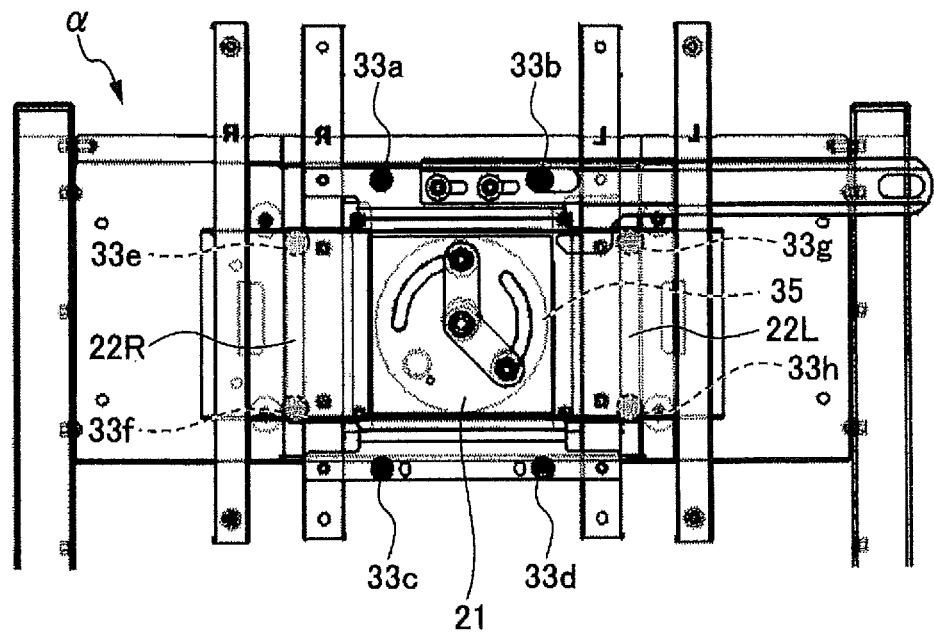
FIGS. 7A and 7B are views illustrating positions of bushing members when a display is in a landscape orientation and in a portrait orientation.
Figure 7B:
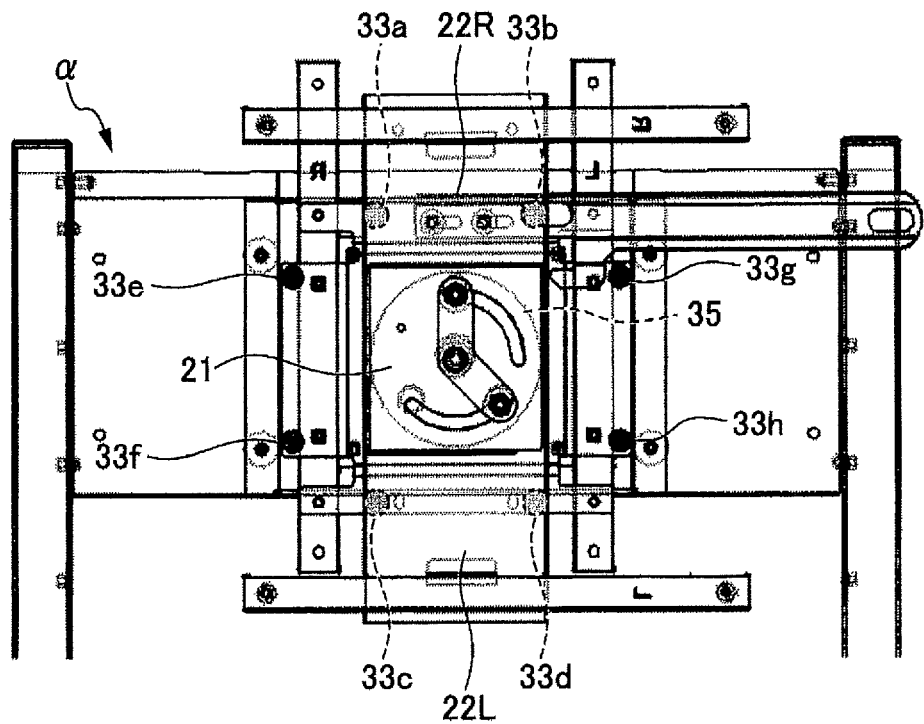

FIGS. 7A and 7B illustrate positions of the bushing members when the display 1 is in the landscape and portrait orientations.

As illustrated in FIG. 7A, when the display 1 is in the landscape orientation, the right bushing members 33e and 33f, and the left bushing members 33h and 33g are respectively proximate to the supporting plates 22R and 22L, which sandwich the sliding plate 21 of the rotating unit moving part 20 between the supporting plates 22R and 22L.

When a user does not touch the display 1, such as when the display 1 is used as a display panel in the landscape orientation, the bushing members 33e and 33f, and the bushing members 33h and 33g are not in contact with the supporting plates 22L and 22R, respectively. In contrast, when a writing pressure is applied in the rearward direction on either left or right side, the tips of the bushing members (33e, 33f) or (33h, 33g) contact the supporting plate 22R or 22L. When any of the bushing members 33e, 33f, 33h, or 33g comes into contact with a corresponding one of the supporting plate 22R and 22L, the display 1 will not be pushed further toward the rear side, and the distance from which the display 1 is pushed rearward will be shortened. Thus, it is possible to prevent rattling of the display 1 during writing when a writing instrument contacts or separates from the display 1.

Meanwhile, as illustrated in FIG. 7B, when the display 1 is in the portrait orientation, the upper bushing members 33a and 33b, and lower bushing members 33c and 33d are respectively proximate to the supporting plates 22R and 22L.

When a user does not touch the display 1, such as when the display 1 is used as a display panel in the portrait orientation, the right and left bushing members 33a, 33b, 33c, and 33d do not contact the supporting plates 22R and 22L. In contrast, when pressure is applied in the rearward direction on either the top or bottom side of the display 1, the tips of the bushing members (33a and 33b) or (33c and 33d) contact the supporting plate 22R or 22L. When any of the bushing members 33a, 33b, 33c, and 33d comes into contact with a corresponding one of the supporting plates 22R and 22L, the distance from which the display 1 is pushed rearward will be shortened, and it is possible to prevent generation of rattling of the display 1 during writing.

Thus, the bushing members 33a to 33f hold the rotating unit moving part 20 in an area outside of the large spacer 35 with respect to the center of rotation. With this configuration, it is possible to further reduce the generation of rattling when the display 1 actually used for writing is in the landscape orientation or in the portrait orientation.

<Locking Member>

Next, a configuration of a locking member (rotation locking lever) 34 will be described with reference to FIGS. 8A to 8F, FIGS. 9A to 9E, and FIGS. 10A to 10G.

FIGS. 8A to 8F are views illustrating a locking member that has locked a display 1 in a horizontal orientation (landscape orientation). FIGS. 9A to 9E are views illustrating a locking member that has locked the display 1 in a vertical orientation (portrait orientation).

The locking member (hereinafter referred to as "rotation locking lever") 34 disposed on the rotating unit fixed part 30 is a lever-like member configured to engage a part of the rotating unit moving part 20 to secure the display 1 in either a landscape or a portrait orientation.

Specifically, the rotation locking lever 34 of the rotating unit fixed part 30 extends horizontally, and is coupled to the upper overhang part 314 of the fixing plate 31 above the rotating large spacer 35 in an area outside of the large spacer 35 with respect to the center of rotation. FIGS. 8A to 8F illustrate an example where the rotation locking lever 34 is disposed above the large spacer 35 when the display 1 is in the landscape orientation. However, the rotation locking lever may be disposed below the large spacer 35 when the display 1 is in the landscape orientation.

The rotation locking lever 34 includes a horizontally extending lever 340 and an L-shaped hook member 341.

The extending lever 340 has an operating hole 342 formed at a tip thereof, and a bush hole 343 formed in an area overlapping the fixing plate 31. The operating hole 342 is a hole for being held by a user during operation of the rotation locking lever 34. The bush hole 343 is a hole formed so as not to touch the bushing member 33b when the extending lever 340 moves.

The L-shaped hook member 341 has a falling portion 341a extending downward from the extending lever 340 and a claw portion 341b at the tip of the falling portion 341a.

Meanwhile, a first hole 241 and a second hole 242 are formed on an upper supporting frame 24 of the rotating unit moving part 20. The first hole 241 elongated in an extending direction to be longer than the second hole 242. A hole 261 is formed near an upper end of a right-side partition frame 26.

Figure 8C:
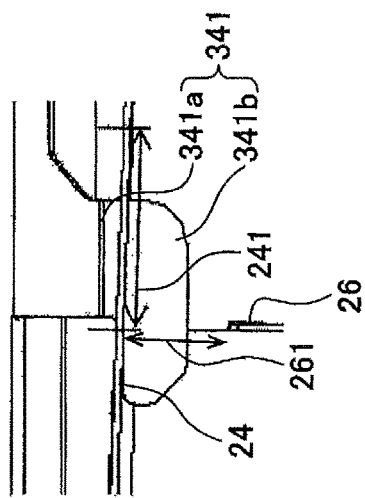
FIGS. 8A to 8F are views illustrating a locking member when the display is in a landscape orientation.
Figure 8B:
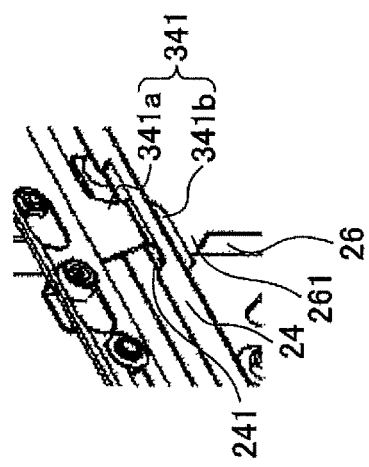
Figure 8A:
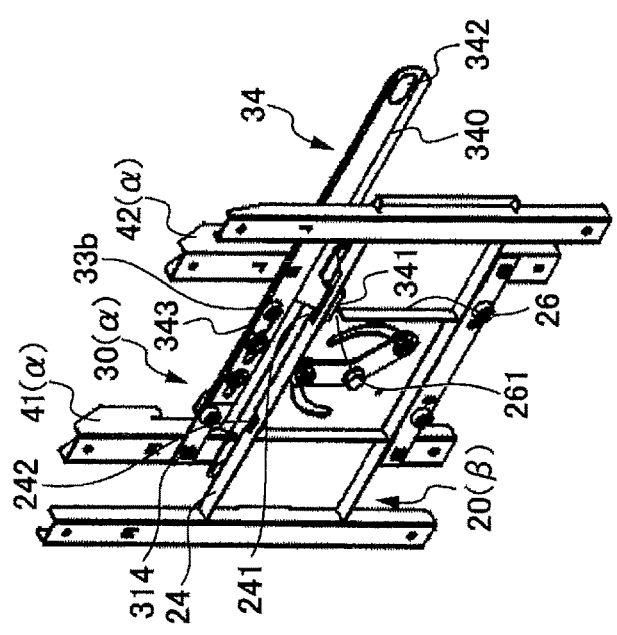
Figure 8F:
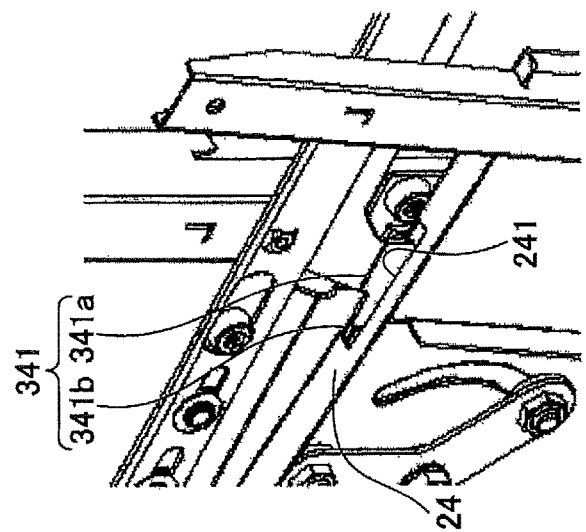
Figure 8E:
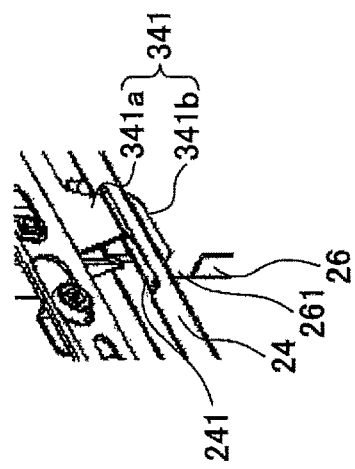
Figure 8D:
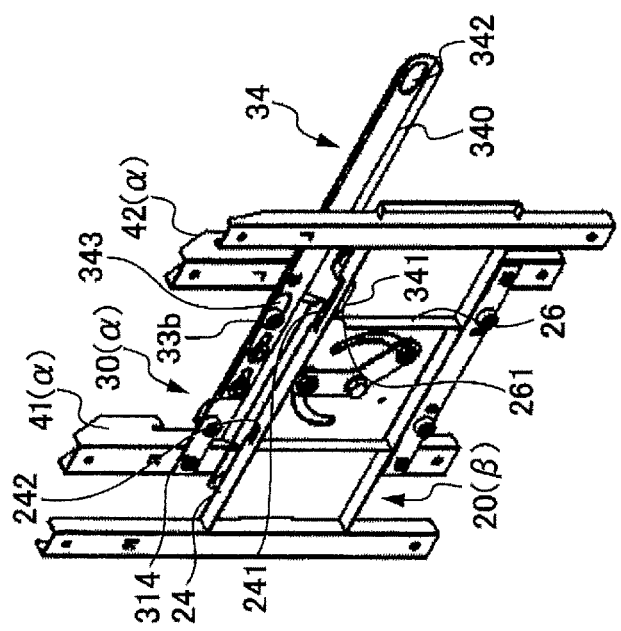

Of the landscape orientation illustrated in FIGS. 8A to 8F, FIGS. 8A to 8C depict a locked condition and FIGS. 8D to 8F depict an unlocked condition. FIGS. 8B and 8C are partial enlarged views of FIG. 8A. FIGS. 8E and 8F are partial enlarged views of FIG. 8D.

The hook member 341 of the rotation locking lever 34 is inserted into a first hole 241 formed on the supporting frame 24 (first supporting frame) to be proximate to a part of an elongated peripheral surface of the first hole 241 of the supporting frame 24, thereby preventing the display 1 from rotating from its portrait orientation. Specifically, in the locked condition, as illustrated in FIGS. 8B and 8C, the hook member 341 of the rotation locking lever 34 is inserted into the first hole 241, and a claw portion 341b of the hook member 341 is subsequently inserted into the hole 261 of the partition frame 26 (first partition frame), so that an upper surface of the claw portion 341b is proximate to a lower surface (an inner surface) of the supporting frame 24. This restricts rotation of the rotating unit moving part 20. In this condition, when a force is applied toward the rotation direction, contact between the upper surface of the claw portion 341b and the lower surface of the upper frame 24 blocks rotation and thus prevents rotation.

However, in the unlocked condition illustrated in FIGS. 8D to 8F, the hook member 341 is inserted into the first hole 241, and the claw portion 341b is within an area of the first hole 241, so as not to face the supporting frame 24. In this condition, when a force is applied in the rotation direction, there is no member or portion that blocks the rotation, and the rotation proceeds as illustrated in FIG. 8F.

Figure 9E:
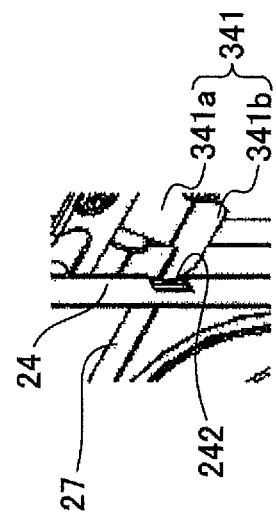
Figure 9D:
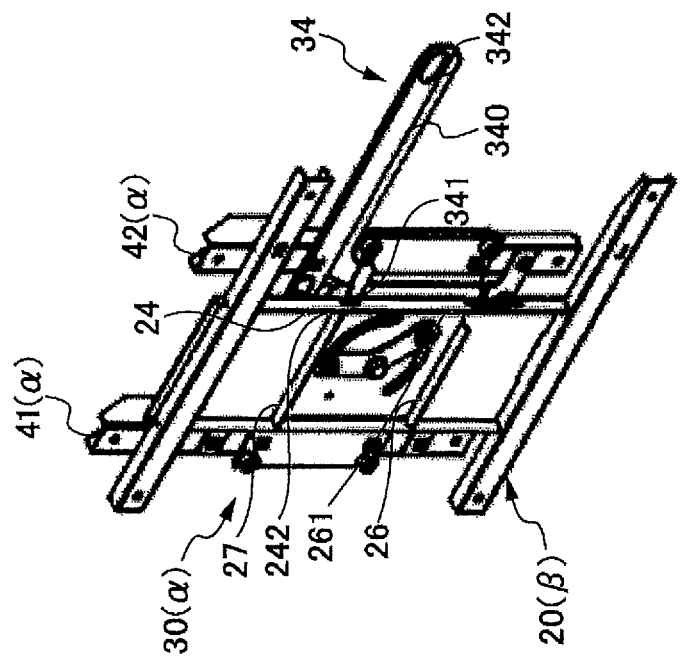

FIGS. 9A to 9E illustrate the display 1 in the portrait orientation, where FIGS. 9A to 9C depict a locked condition, and FIGS. 9D to 9E depict an unlocked condition. FIGS. 9B and 9C are partial enlarged views of FIG. 9A. FIG. 9E is a partially enlarged view of FIG. 9D.

The hook member 341 of the rotation locking lever 34 is inserted into the second hole 242 formed on the supporting frame (upper supporting frame) 24 and is proximate to one end of the second hole 242 so as to prevent rotation of the display 1 from its portrait orientation. Specifically, as illustrated in FIGS. 9B and 9C, when the claw portion 341b of the hook member 341 enters the second hole 242 of the supporting frame 24, the upper surface of the claw portion 341b faces and is proximate to the upper end of the second hole 242. This restricts the rotation of the rotating unit moving part 20. In this condition, when a force is applied in the rotation direction, contact between the upper surface of the claw portion 341b and the upper end of the second hole 242 of the supporting frame 24 blocks the rotation and thus prevents the rotation.

However, in the unlocked condition illustrated in FIGS. 9D to 9E, the hook member 341 does not enter the second hole 242 and the claw portion 341b is located outside the partition frame 27 and the supporting frame 24. In this condition, when a force is applied in the rotation direction, there is no member or portion that blocks the rotation, and the rotation thus proceeds.

FIGS. 10A to 10G are views illustrating an operation of the lock lever during rotation.

As illustrated in FIGS. 10A to 10G, when viewed from the rear side of the display stand system, an operating end (the operating hole 342) of the rotation locking lever 34 protrudes horizontally from the outside of the support post 51R so as to be operable from the rear side of the display stand system.

When display 1 is in the landscape orientation (FIG. 10A), pulling of the rotation locking lever 34 in an OFF direction unlocks (from FIG. 10E to FIG. 10D) the rotation restriction by the hook member 341. This enables the display 1 to be rotatable (from FIG. 10A to FIG. 10B). Then, rotation of the display 1 is continued to switch from the landscape orientation (horizontal orientation) to the portrait orientation (vertical orientation)(from FIG. 10A to FIG. 10B).

Figure 10C:
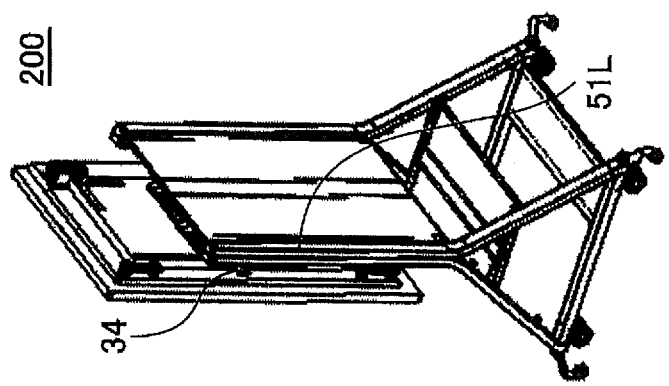
FIGS. 10A to 10G are views illustrating positions of the locking member relative to the display stand system.
Figure 10B:
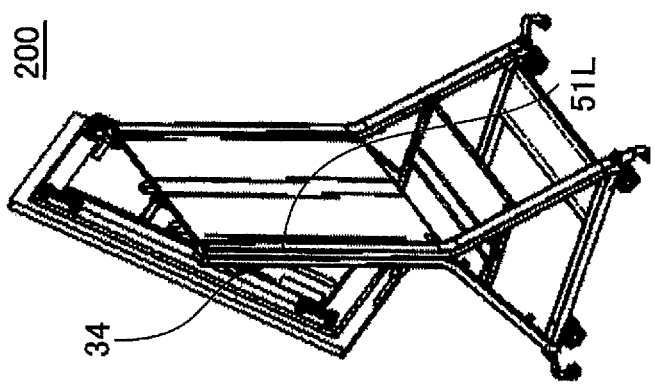
Figure 10A:
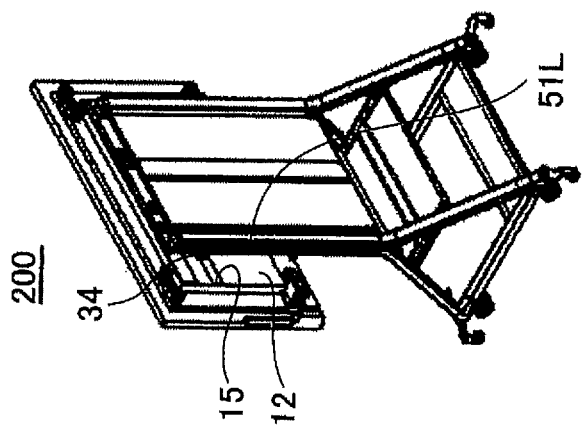
Figure 10D:
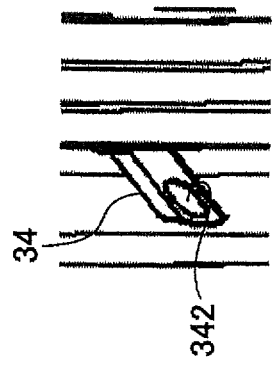
Figure 10F:
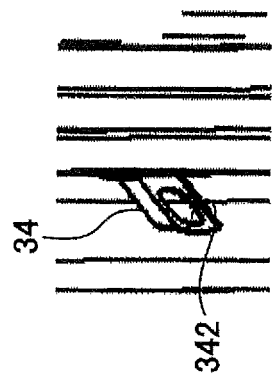
Figure 10E:
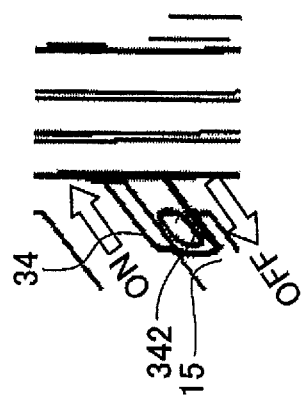
Figure 10G:
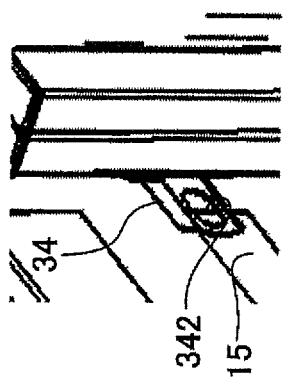

When the display 1 reaches the portrait orientation, the rotation locking lever 34 is pushed in an ON direction to make the portrait orientation in the locked condition (from FIG. 10F to FIG. 10G).

Conversely, when the display 1 is switched from the portrait orientation to the landscape orientation, the rotation locking lever 34 is pulled unlocked (from FIG. 10G to FIG. 10F), and then the display 1 is rotated to switch to the landscape orientation (from FIG. 10B to FIG. 10A). When the display 1 reaches the landscape orientation (FIG. 10B to FIG. 10A), the rotation locking lever 34 is pushed again to make the landscape orientation in the locked condition (FIG. 10D to FIG. 10E).

As illustrated in FIGS. 10A, 10D, and 10E, when the display 1 is in the landscape orientation, the operating end of the rotation locking lever 34 is proximate to a thick area of the rear surface 12, Hence, a locking operation groove 15 is formed on the rear surface 12 of the display 1 so that the rotation locking lever 34 can be operated without being interfered with the rear surface 12 of the display 1. Meanwhile, as illustrated in FIGS. 10B, 10F, and 10G, when the display 1 is in the portrait orientation, the operating end of the rotation locking lever 34 is away from the rear surface of the display 1 in an area where a thick portion to a thin portion of the rear surface is switched. This secures operability even without grooves or the like.

With the above-described configuration, even when unexpected force is applied when the actually used display is in the landscape or portrait orientation, the rotation of the display is prevented. Thus, there is no danger of the display falling down even when a user carelessly leans on the display. In addition, even when a user holds the display 1 part of the display stand system 200 to move the display stand system 200 during transportation of the display stand system 200 as the entire stand, a failure such as unexpected rotation of the display 1 will not occur. Thus, the display stand system 200 can be moved stably.

As described above, it is possible to prevent generation of rattling when a user is writing on the display device, and to prevent unexpected rotation of the display device while the display device (display) is rotatably suspended on a stand according to the present embodiment.

The aforementioned rotating unit, which is capable of preventing generation of rattling and preventing unexpected rotation, may also be distributed as an optional member alone as a rotating unit to be attached to a stand and a display device.

While the preferred embodiment of the invention has been described in detail above, the invention is not limited to the particular embodiment, and various alterations and modifications are possible within the scope of the spirit of the embodiment of the invention as defined in the appended claims.

What is claimed is:

1. A stand to suspend a display, the stand comprising:
a stand portion including a plurality of supporting posts and a mounting plate connecting between the plurality of supporting posts; and
a rotator to change orientation of the display between a landscape orientation and a portrait orientation without detaching the display, the display being horizontally supported in the landscape orientation, and the display being vertically supported in the portrait orientation,
wherein the rotator includes a rotator fixed part fixed to the stand portion, and a rotator moving part fixed to a rear surface of the display to move together with the display,
wherein the rotator fixed part includes a fixing plate having two or more holes, a first spacer having two or more holes, and two or more second spacers each having one hole, the two or more second spacers being smaller than the first spacer, and
wherein the rotator moving part includes a sliding planar part having two or more holes,
wherein in a state where a rear surface of the sliding planar part is in surface contact with a front surface of the first spacer, and peripheries of the two or more holes of a front surface of the sliding planar part are in surface contact with the two or more second spacers, the fixing plate and the sliding planar part are coupled by fastening two or more first fasteners with respective second fasteners, the two or more first fasteners having respective shaft portions and being inserted into the two or more holes of the fixing plate, the two or more holes of the first spacer, the two or more holes of the sliding planar part, and the two or more holes of the second spacers so as to be fastened with the second fasteners having respective hole portions, and
wherein the front surface of the first spacer continues to be in contact with the peripheries of the two or more holes of the rear surface of the sliding planar part while positions of the two or more holes of the sliding planar part move together with rotation of the display.

2. The stand according to claim 1,
wherein the first spacer includes three holes,
wherein the two or more holes formed on the sliding planar part include a central hole and two arc-shaped slots, the central hole acting as a center of rotation and having substantially the same size as one of the holes acting as a central hole of the first spacer, and the two arc-shaped slots each being located at a same distance from the central hole acting as the center of rotation,
wherein the two or more second spacers are three small spacers that are disposed in surface contact with the central hole and the two arc-shaped slots, respectively, and
wherein the fixing plate and the sliding planar part are coupled by fastening three first fasteners with three second fasteners, the three first fasteners being inserted into three holes of the fixing plate, the three holes of the first spacer, and the central hole and the two arc-shaped slots of the sliding planar part so as to be fastened with the three second fasteners.

3. The stand according to claim 1,
wherein of the rotator, the rotator moving part includes supporting plates that sandwich the sliding planar part from outside in a width direction when the display is in the landscape orientation, and the rotator fixed part includes a plurality of bushings that protrude from the fixing plate toward a front side in an area outside of the first spacer with respect to the center of rotation, and wherein the is bushings are proximate to rear surfaces of the supporting plates when the display is in the landscape or the portrait orientation.

4. The stand according to claim 3, wherein the bushings include:

right and left bushings disposed on right and left sides of the first spacer such that the first spacer is interposed in a horizontal direction by the right and left bushings, and upper and lower bushings disposed on upper and lower sides of the first spacer such that the first spacer is interposed in a vertical direction by the right and left bushing members, wherein when the display is in the landscape orientation, the right and left bushings are proximate to the rear surfaces of the supporting plates of the rotator moving part, and wherein when the display is in the portrait orientation, the upper and lower bushings are proximate to the rear surfaces of the supporting plates of the rotator moving part.

5. The stand according to claim 1, wherein the rotating fixed part of the rotator includes a rotation locking lever to engage a part of the rotator moving part to secure the display in either the landscape orientation or the portrait orientation.

6. The stand according to claim 5, wherein the rotation locking lever is coupled to the fixing. plate on an upper or lower side of the first spacer and extends horizontally in an area outside of the first spacer with respect to the center of rotation, and the rotation locking lever has an L-shaped hook, wherein the rotator moving part includes:

supporting plates configured to sandwich the sliding planar part from outside in a horizontal direction when the display is in the landscape orientation, first and second supporting frames to support the sliding planar part and the supporting plates in a vertical direction when the display is in the landscape orientation, and first and second partition frames configured to define a boundary between the sliding planar part and each of the supporting plates disposed on two opposite sides of the sliding planar part, and wherein the hook is inserted into a first hole on the first supporting frame and a hole formed on the first partition frame to allow a tip of the hook to be proximate to a part of an elongated peripheral surface of the first hole of the first supporting frame so as to prevent the display from rotating from the portrait orientation.

7. The stand according to claim 6, wherein the hook is inserted into a second hole formed on the first supporting frame, and the tip of the hook is proximate to one end of the second hole so as to prevent the display from rotating from the portrait orientation.

8. A display stand system comprising:

the stand according to claim 1; and the display suspended on the stand.

9. A rotator for a display, the rotator being attached to a rear surface of the display to be mounted on a stand, the rotator being capable of changing orientation of the display between a landscape orientation and a portrait orientation without detaching the display, the rotator comprising:

a rotator fixed part fixed to the stand; and a rotator moving part fixed to a rear surface of the display to move together with the display, wherein the rotator fixed part includes a fixing plate having two or more holes, a first spacer having two or more holes, and two or more second spacers each having one hole, the first spacer being larger than the two or more second spacers, and wherein the rotator moving part includes a sliding planar part having two or more holes, wherein in a state where a rear surface of the sliding planar part is in surface contact with a front surface of the first spacer, and peripheries of the two or more holes of a front surface of the sliding planar part are in surface contact with the two or more second spacers, the fixing plate and the sliding planar part are coupled by fastening two or more first fasteners with respective second fasteners, the two or more first fasteners having respective shaft portions and being inserted into the two or more holes of the fixing plate, the two or more holes of the first spacer, the two or more holes of the sliding planar part, and the two or more holes of the second spacers so as to be fastened with the second fasteners having respective hole portions, and wherein the front surface of the first spacer continues to be in contact with the peripheries of the two or more holes of the rear surface of the sliding planar part while positions of the two or more holes of the sliding planar part move together with rotation of the display.

* * * * *